United States Patent
Tsai et al.

(10) Patent No.: US 8,605,447 B2
(45) Date of Patent: Dec. 10, 2013

(54) PRINTED CIRCUIT BOARD ASSEMBLY

(75) Inventors: Lung-Sheng Tsai, Taipei Hsien (TW); Yi-Lung Chou, Taipei Hsien (TW); Li-Ping Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 403 days.

(21) Appl. No.: 12/955,926

(22) Filed: Nov. 30, 2010

(65) Prior Publication Data

US 2012/0018214 A1 Jan. 26, 2012

(30) Foreign Application Priority Data

Jul. 20, 2010 (CN) .......................... 2010 1 0231590

(51) Int. Cl.
*H05K 1/14* (2006.01)
(52) U.S. Cl.
USPC ........... 361/740; 361/807; 361/810; 361/809; 361/679.33; 361/727; 174/535
(58) Field of Classification Search
USPC .................... 361/758, 740, 757, 809, 679.33, 361/679.34, 754, 679.36; 174/535
See application file for complete search history.

(56) References Cited

U.S. PATENT DOCUMENTS

| | | | |
|---|---|---|---|
| 5,124,888 A * | 6/1992 | Suzuki et al. ................. | 361/740 |
| 5,136,468 A * | 8/1992 | Wong et al. ................. | 361/679.6 |
| 5,691,504 A * | 11/1997 | Sands et al. .................. | 174/372 |
| 6,082,695 A * | 7/2000 | Leong ...................... | 248/346.01 |
| 6,761,273 B1 * | 7/2004 | Chen et al. ................. | 211/41.17 |
| 7,031,152 B1 * | 4/2006 | Tsai et al. ................. | 361/679.33 |
| 7,113,409 B1 * | 9/2006 | Whitted ........................ | 361/804 |
| 2003/0124887 A1 * | 7/2003 | Bloomfield et al. ............ | 439/92 |
| 2007/0025067 A1 * | 2/2007 | Chen ............................ | 361/679 |
| 2008/0165491 A1 * | 7/2008 | Iwaasa .......................... | 361/685 |
| 2009/0059547 A1 * | 3/2009 | Maeda .......................... | 361/809 |

* cited by examiner

*Primary Examiner* — Tuan T Dinh
*Assistant Examiner* — Steven Sawyer
(74) *Attorney, Agent, or Firm* — Altis Law Group, Inc.

(57) ABSTRACT

A mounting apparatus for a printed circuit board includes an enclosure and a tray. The enclosure includes a bottom wall and a side wall extending from the bottom wall. The side wall is substantially perpendicular to the bottom wall. The tray includes a bottom panel substantially parallel to the bottom wall and a side panel substantially perpendicular to the bottom panel. The bottom panel is configured to secure the printed circuit board, and the side panel contacts and is mounted to the side wall.

9 Claims, 3 Drawing Sheets

PRINTED CIRCUIT BOARD ASSEMBLY

BACKGROUND

1. Technical Field

The present disclosure relates to a printed circuit board assembly for mounting a printed circuit board.

2. Description of Related Art

A conventional computer system usually includes a computer case and a printed circuit board mounted in the computer case. The installation of the printed circuit board in the computer case usually involves the use of screws, which is inconvenient. The screws are small and difficult to manipulate and install. Additionally, because of their small size, the screws may be dropped during the process, possibly causing damage to other parts in the computer case.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
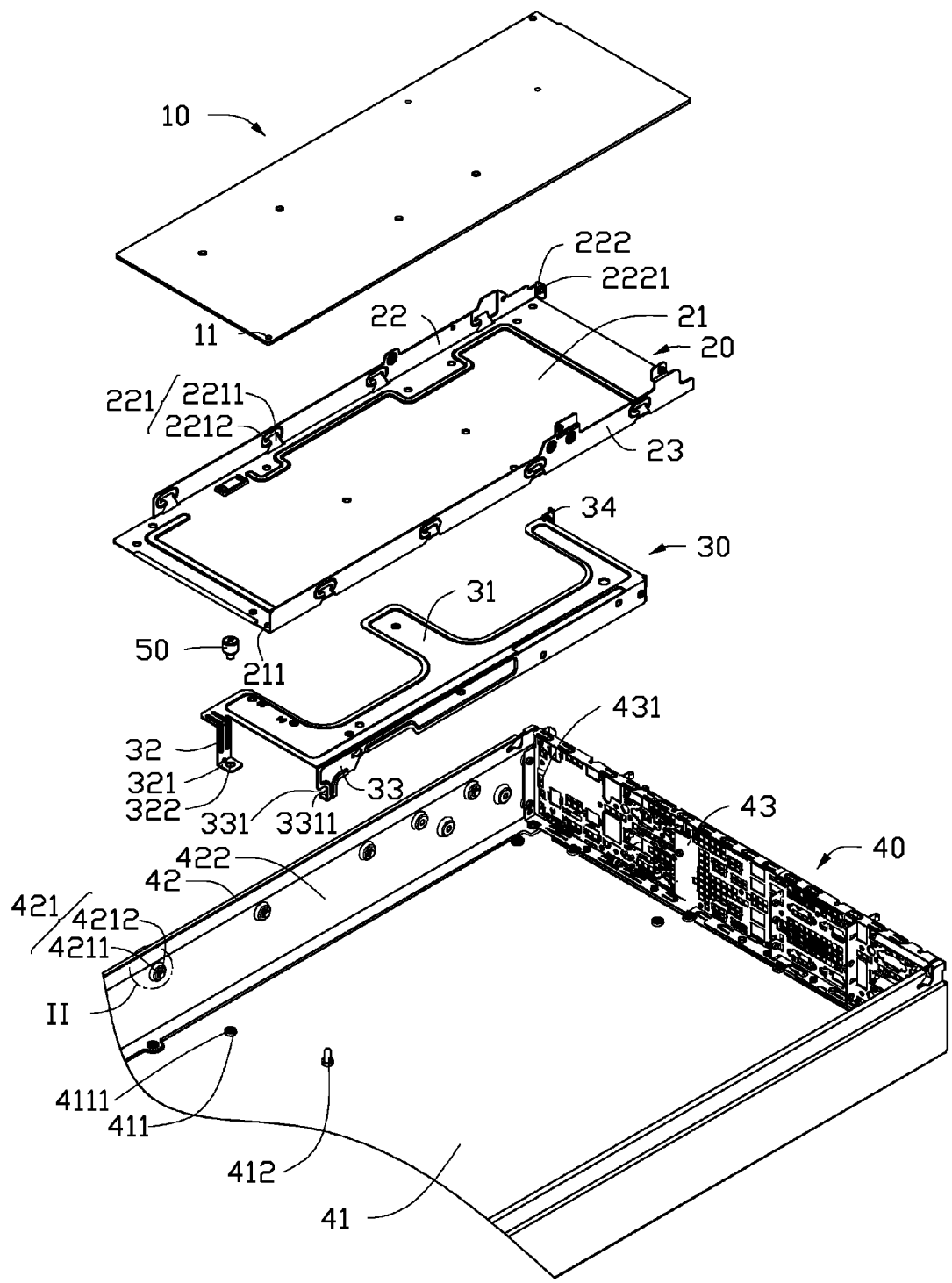
FIG. 1 is an exploded, isometric view of a printed circuit board assembly of an embodiment, including a tray and an enclosure.

Referring to FIG. 1, a printed circuit board assembly includes a printed circuit board 10, a tray 20 for mounting the printed circuit board 10, a supporting element 30, and an enclosure 40.

Figure 2:
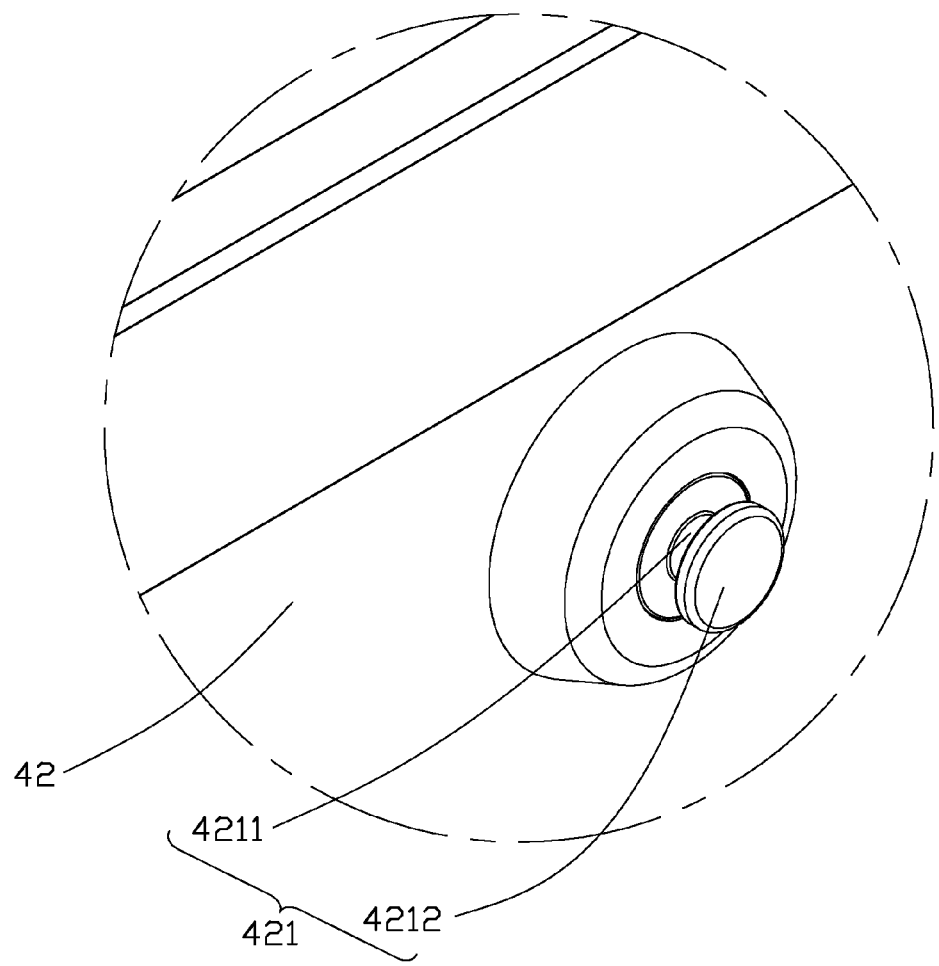
FIG. 2 is an enlarged view of section II of FIG. 1.

Referring to FIGS. 1 and 2, a number of through holes 11 are defined in the printed circuit board 10. The tray 20 includes a bottom panel 21 substantially parallel to the printed circuit board 10, a first side panel 22, and a second side panel 23. The first side panel 22 and the second side panel 23 extend perpendicularly from opposite sides of the bottom panel 21 of the tray 20. A number of securing holes 211 are defined in the bottom panel 21 corresponding to the through holes 11 of the printed circuit board 10. A number of mounting openings 221 are defined in the first side panel 22. Each mounting opening 221 includes a wide part 2211 and a narrow part 2212 connected to the wide part 2211. The first side panel 22 includes a stopping tab 222. The stopping tab 222 includes a stop protrusion 2221. When the printed circuit board 10 is mounted on the bottom panel 21, the stopping protrusion 2221 prevents the printed circuit board 10 from moving along a direction, which is perpendicular to the bottom panel 21.

The enclosure 40 includes a bottom wall 41, that is substantially parallel to the bottom panel 21 of the tray 20, a side wall 42, that is perpendicular to the bottom wall 41, and a rear wall 43, that is perpendicular to the bottom wall 41 and the side wall 42. The bottom wall 41 includes a securing portion 411 and a positioning protrusion 412. A securing hole 4111 is defined in the securing portion 411. The side wall 42 includes a side wall body 422 and a number of mounting protrusions 421 protruding from the side wall body 422, corresponding to the mounting openings 221 of the tray 20. Each mounting protrusion 421 includes a neck portion 4211, extending from the side wall body 422, and a head portion 4212, extending from the neck portion 4211. The neck portion 4211 and the head portion 4212 are columnar. The cross section of the head portion 4212 is greater than that of the neck portion 4211 taken along a plane parallel to the side panel body 422. The cross section of the head portion 4212 is greater than the narrow part 2212 of the mounting opening 221, but less than the wide part 2211 of the mounting opening 221. The cross section of the neck portion 4211 taken along the plane is less than the narrow part 2212 of the mounting opening 221. A supporting opening 431 is defined in the rear wall 43.

The supporting element 30 includes a main body 31, a first supporting arm 32 and a second supporting arm 33 extending downwardly from the main body 31. The first supporting arm 32 includes a mounting portion 321. A mounting hole 322 is defined in the mounting portion 321, corresponding to the securing hole 4111 of the enclosure 40. The second supporting arm 33 includes a positioning portion 331. A positioning hole 3311 is defined in the positioning portion 331, corresponding to the positioning protrusion 412. The supporting element 30 includes an extending portion 34 extending from the main body 31, corresponding to the supporting opening 431 of the enclosure 40.

Figure 3:
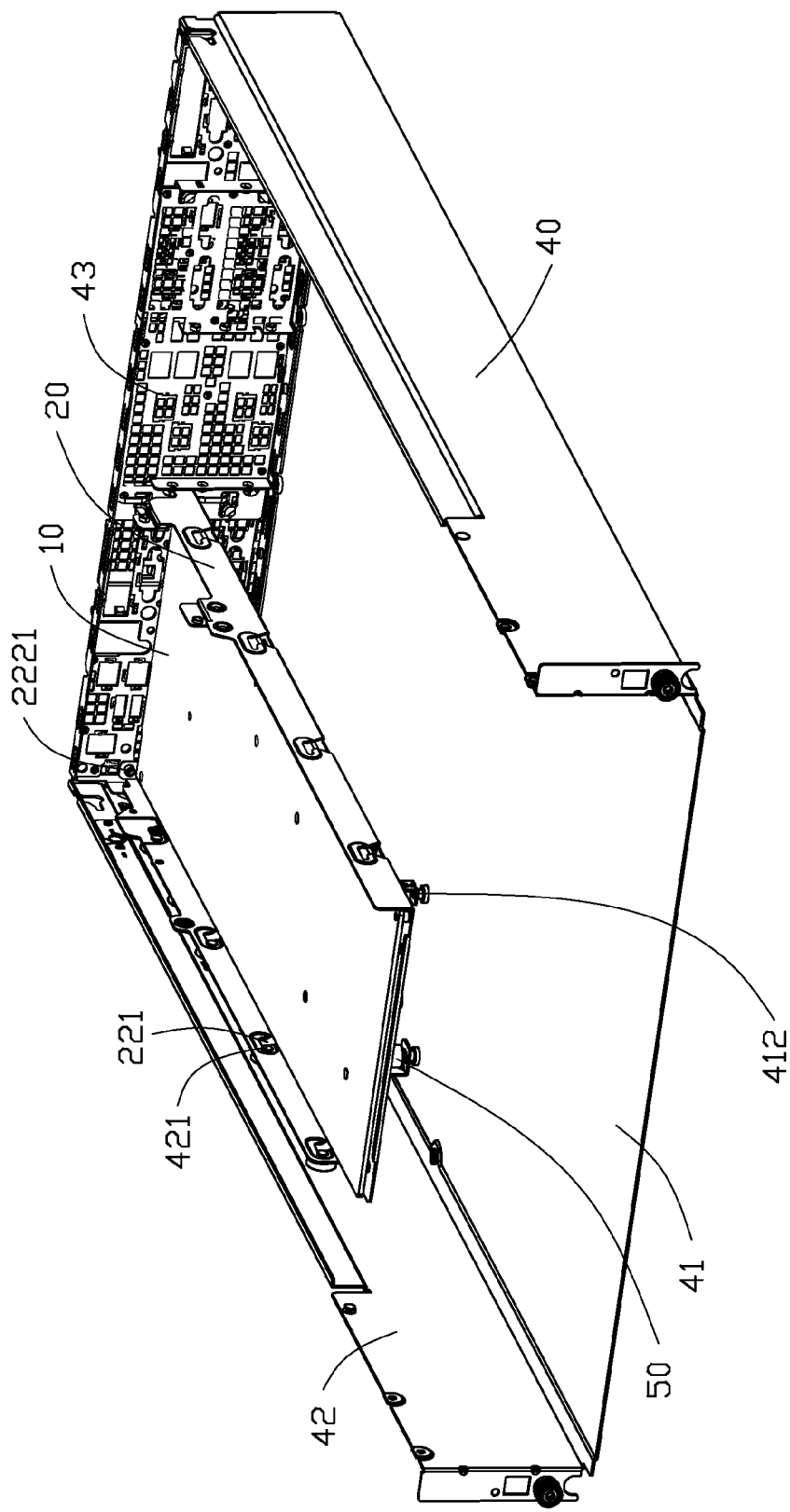
FIG. 3 is an assembled view of FIG. 1.

Referring to FIGS. 1 to 3, in assembly, the extending portion 34 is placed in the supporting opening 431 of the enclosure 40. The positioning protrusion 412 of the enclosure 40 is received in the positioning hole 3311 of the second supporting arm 33 of the supporting element 30. The mounting hole 322 of the first supporting arm 32 is aligned with the securing hole 4111 of the enclosure 40. A securing element 50, such as a screw, is extended through the mounting hole 322, then screwed into the securing hole 4111, thereby securing the supporting element 30 to the enclosure 40. The printed circuit board 10 is placed on the bottom panel 21 of the tray 20 to enable one terminal of the printed circuit board 10 to be disposed between the stopping protrusion 2221 of the tray 20 and the bottom panel 21. The through holes 11 of the printed circuit board 10 are aligned with the securing holes 211 of the bottom panel 21. A number of securing elements (not shown), such as screws, extend through the through holes 11, then are screwed into the securing holes 211, thereby securing the printed circuit board 10 to the tray 20. Then, the wide parts 2211 of the mounting openings 221 of the tray 20 are aligned with the mounting protrusions 421. The tray 20 is moved towards the side wall 42 of the enclosure 40 to enable the head portions 4212 of the mounting protrusions 421 to extended through the corresponding wide parts 2211. The tray 20 is moved away from the rear wall 43. The narrow parts 2212 of the mounting openings 221 are moved towards the corresponding neck portions 4211 of the mounting portions 421 until the neck portions 4211 are received in the corresponding narrow parts 2212. At this time, the bottom panel 21 of the tray 20 is disposed on the main body 31 of the supporting element 30.

In disassembly, the tray 20 is moved towards the rear wall 43 of the enclosure 40 to enable the mounting protrusions 421 to be disposed in the wide parts 2211 of the mounting openings 221. The tray 20 is moved away from the side wall 42 to enable the mounting protrusions 421 to be separated from the mounting openings 221.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for a printed circuit board, comprising
an enclosure, the enclosure comprising a bottom wall, a rear wall extending from the bottom wall, and a side wall extending from the bottom wall; the side wall substantially perpendicular to the bottom wall; the rear wall is substantially perpendicular to the bottom wall and the side wall; and the rear wall defining a supporting opening;
a tray, the tray comprising a bottom panel substantially parallel to the bottom wall and a side panel substantially perpendicular to the bottom panel, the bottom panel is configured to secure the printed circuit board, and the side panel contacts and is mounted to the side wall; and
a support element, the support element comprising a main body contacting the bottom panel and located between the bottom panel and the bottom wall, a supporting arm extending from the main body, and an extending portion extending from the main body; the supporting arm contact the bottom wall; and the extending portion is received in the supporting opening to prevent the support element from moving along a direction substantially perpendicular to the bottom wall;
wherein the side wall comprises a side wall body and a mounting protrusion extending from the side wall body, and a mounting opening, defined in the side panel, is configured to engage the mounting protrusion to mount the tray to the side wall; the mounting opening comprises a wide part and a narrow part; and the mounting protrusion is configured to extend through the wide part and be slid to the narrow part.

2. The mounting apparatus of claim 1, wherein the mounting protrusion comprises a neck portion extending from the side wall body and a head portion extending from the neck portion; a cross section of the neck portion is less than that of the head portion taken along a plane parallel to the side wall body; the cross section of the head portion is greater than the narrow part; and the neck portion is configured to be slid in the narrow part.

3. The mounting apparatus of claim 1, wherein the tray further comprises a stopping tab, the stopping tab comprises a stopping protrusion configured to prevent the printed circuit board from moving along a direction substantially perpendicular to the bottom panel.

4. The mounting apparatus of claim 1, wherein a positioning hole is defined in the arm, and the bottom wall comprises a positioning protrusion corresponding to the positioning hole.

5. The mounting apparatus of claim 1, wherein a mounting hole is defined in the supporting arm, and a securing hole is defined in the bottom wall corresponding to the mounting hole; and a securing element is extended through the mounting hole and the securing hole to secure the supporting element to the bottom wall.

6. An electronic device, comprising:
an enclosure, the enclosure comprising a bottom wall, a rear wall extending from the bottom wall, and a side wall extending from the bottom wall; the side wall substantially perpendicular to the bottom wall; the rear wall is substantially perpendicular to the bottom wall and the side wall; and the rear wall defining a supporting opening;
a tray, the tray comprising a bottom panel substantially parallel to the bottom wall, the tray mounted to the side wall;
a printed circuit board, the printed circuit board mounted on the bottom panel of the tray; and
a support element, the support element comprising a main body contacting the bottom panel and located between the bottom panel and the bottom wall, a supporting arm extending from the main body, and an extending portion extending from the main body; the supporting arm contacting the bottom wall; and the extending portion received in the supporting opening to prevent the support element from moving along a direction substantially perpendicular to the bottom wall;
wherein the side wall comprises a side wall body and a mounting protrusion extending from the side wall body, and a mounting opening defined in the tray, is configured to engage the mounting protrusion to mount the tray to the side wall; the mounting opening comprises a wide part and a narrow part; and the mounting protrusion is configured to extend through the wide part and be slid to the narrow part.

7. The electronic device of claim 6, wherein the mounting protrusion comprises a neck portion extending from the side wall body and a head portion extending from the neck portion; a cross section of the neck portion is less than that of the head portion taken along a plane parallel to the side wall body; the cross section of the head portion is greater than the narrow part; and the neck portion is configured to be slid in the narrow part.

8. The electronic device of claim 6, wherein the tray further comprises a side panel extending from the bottom panel, the side panel substantially perpendicular to the bottom panel, the mounting opening defined in the side panel.

9. The electronic device of claim 6, wherein the tray further comprises a stopping tab, the stopping tab comprises a stopping protrusion, the printed circuit board disposed between the bottom panel and the stopping protrusion to be prevented from moving along a direction substantially perpendicular to the bottom panel.

* * * * *